(12) United States Patent
Gao

(10) Patent No.: US 6,207,533 B1
(45) Date of Patent: Mar. 27, 2001

(54) METHOD FOR FORMING AN INTEGRATED CIRCUIT

(75) Inventor: Feng Gao, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/415,306

(22) Filed: Oct. 8, 1999

(51) Int. Cl.$^7$ .................................................. H01L 21/76
(52) U.S. Cl. .................. 438/424; 438/296; 438/359; 438/427
(58) Field of Search .................... 438/296, 424, 438/427, 359

(56) References Cited

U.S. PATENT DOCUMENTS

| | | | |
|---|---|---|---|
| 5,036,015 | 7/1991 | Sandhu et al. ........................... 437/8 |
| 5,173,439 | 12/1992 | Dash et al. ............................. 437/67 |
| 5,272,117 | 12/1993 | Roth et al. ............................ 437/228 |
| 5,433,650 | 7/1995 | Winebarger ............................. 451/6 |
| 5,721,172 | 2/1998 | Jang et al. ............................ 438/424 |
| 5,728,621 | * 3/1998 | Zheng et al. .......................... 438/427 |
| 5,750,433 | * 5/1998 | Jo ........................................ 438/424 |
| 5,817,567 | * 10/1998 | Jang et al. ............................ 438/427 |
| 5,846,882 | 12/1998 | Birang .................................. 438/692 |
| 5,851,135 | 12/1998 | Sandhu et al. ............................ 451/5 |
| 5,872,043 | * 2/1999 | Chen .................................. 438/424 |
| 5,923,993 | * 7/1999 | Sahota ................................ 438/427 |
| 6,048,771 | * 4/2000 | Lin et al. ............................. 438/296 |
| 6,048,775 | * 4/2000 | Yao et al. ............................ 438/427 |
| 6,057,210 | * 5/2000 | Yang et al. ........................... 438/427 |
| 6,071,792 | * 6/2000 | Kim et al. ............................ 438/424 |

* cited by examiner

Primary Examiner—Charles Bowers
Assistant Examiner—David S Blum
(74) Attorney, Agent, or Firm—Wagner, Murabito & Hao LLP

(57) ABSTRACT

In one embodiment, a first dielectric layer (16) is formed overlying a semiconductor substrate (4). A portion of the first dielectric layer (16) is then etched using a patterned masking layer (18). The patterned masking layer (18) is removed and an intermediate polishing layer (20) is formed overlying the first dielectric layer (16). A second dielectric layer (22) is formed overlying the intermediate polishing layer (20), and the second dielectric layer (22) is polished to expose a portion of the intermediate polishing layer (20), and to determine a polishing rate for the second dielectric layer (22). The polishing rate for the second dielectric layer (22) is then used to calculate a polishing time for the first dielectric layer (16), and the first dielectric layer (16) is polished for the calculated time.

26 Claims, 3 Drawing Sheets

METHOD FOR FORMING AN INTEGRATED CIRCUIT

FIELD OF THE INVENTION

The present invention relates to integrated circuit fabrication, and more specifically to a method for planarizing a layer of material in an integrated circuit.

BACKGROUND OF THE INVENTION

Polishing processes, and more specifically chemical-mechanical polishing processes, have been used in the semiconductor industry to prepare both single crystal substrates and silicon on insulator substrates. In addition, chemical-mechanical polishing processes have also been used to planarize various conductive and insulating layers subsequently deposited on these substrates, during the integrated circuit fabrication process. For example, chemical-mechanical polishing has been used to planarize interlevel dielectric layers that lie in between two different levels of metal interconnect. Planarizing the interlevel dielectric layer, prior to the formation of the next level of interconnect, is highly desirable because it allows the next level of interconnect to be subsequently patterned and etched without the formation of conductive metal stringers, which can electrically short adjacent metal lines, and without the formation of thinned or notched metal lines, which can adversely effect device reliability. Similarly, chemical-mechanical polishing has been used to planarize conductive materials, such as tungsten, copper, and aluminum, to form planar contact plugs, via plugs, and interconnects. In addition, chemical-mechanical polishing has also been used to form trench isolation. In this process, trenches are formed and then subsequently filled with a deposited dielectric layer, such as silicon dioxide. The dielectric layer is then polished back to form dielectric filled isolation trenches, which are nearly planar with the adjacent active regions. In addition to being planar, the resulting trench isolation is also desirable because it allows the space separating adjacent active regions to be minimized, and thus allows integrated circuits with high device packing densities to be fabricated.

Unfortunately, it is difficult to accurately and reproducibly polish semiconductor substrates, and the materials subsequently deposited on them. One of the main reasons for is that it is very difficult to accurately and reproducibly determine when a selected thickness of material has been removed by a given polishing process. As a result, the materials being polished may be either under-polished or over-polished. Both of these results may adversely effect the functionality of an integrated circuit. For example, if the interlevel dielectric layer lying between two levels of metal interconnect is over-polished, then its thickness may be insufficient to prevent the two levels of interconnect from being electrically shorted to one another. On the other hand, if the interlayer dielectric layer is under-polished, then its increased thickness may result in the formation of electrically open vias. Similarly, under-polishing and over-polishing may also adversely effect the trench isolation process, as well as metallization processes where a selected thickness of material is to be reproducibly removed by a polishing process. Moreover, operating conditions that effect the polishing rate, such as the roughness of the polishing surface, may also change during the polishing process. Therefore, the inability to accurately and reproducibly determine when a selected thickness of material has been removed by a given polishing process may be further compounded by polishing rates that vary with time.

Accordingly, a need exists for a polishing process that can accurately and reproducibly remove a selected thickness of material.

BRIEF DESCRIPTION OF THE DRAWINGS

The present invention may be more fully understood by a description of certain preferred embodiments in conjunction with the attached drawings in which.

DETAILED DESCRIPTION OF A PREFERRED EMBODIMENT

The present invention provides a method for forming an integrated circuit, wherein a first layer of material is polished to expose an underlying second layer of material, which differs from the first layer of material. Exposure of the underlying layer of material is used to determine the polishing rate of the first layer of material. This polishing rate is then used to determine at least one polishing condition that is used to polish a third layer of material that underlies the second layer of material, and which also differs from the second layer of material. The determined polishing condition allows the third layer of material to be planarized with improved repeatability.

Figure 1:
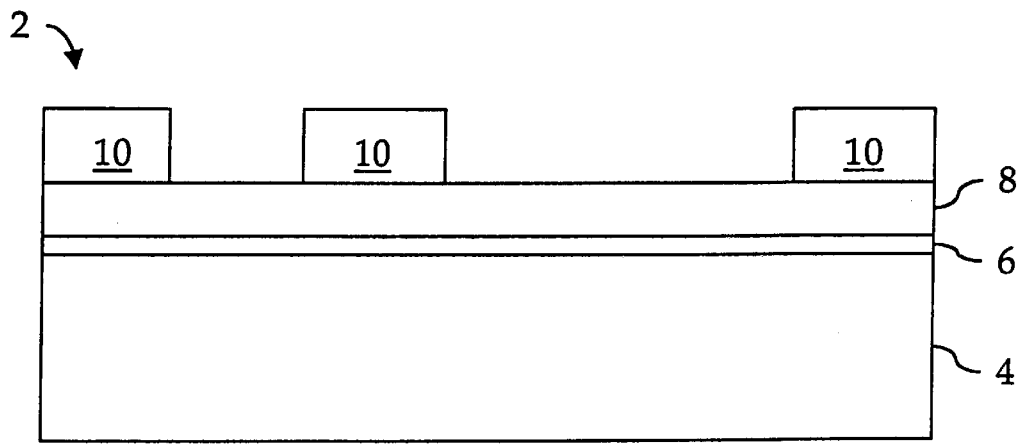
FIGS. 1–8 illustrate, in cross-section, process steps in accordance with one embodiment of the present invention.

FIG. 1 through FIG. 8 illustrate, in cross-section, process steps in accordance with one embodiment of the present invention wherein a trench isolation structure is formed in an integrated circuit. Shown in FIG. 1, is a portion 2 of an integrated circuit structure comprising a semiconductor substrate 4, a buffer layer 6, a protective layer 8, and a photoresist mask 10. Semiconductor substrate 4 is preferably a monocrystalline silicon substrate. Alternatively, semiconductor substrate 4 may be a silicon-on-insulator (SOI) substrate, a silicon-on-sapphire (SOS) substrate, a silicon-germanium substrate, or the like. Buffer layer 6 typically has a thickness ranging from 5 to 100 nanometers, and is preferably a thermal oxide layer which is formed by thermally oxidizing a portion of semiconductor substrate 4. Alternatively, buffer layer 6 may be a chemical vapor deposited silicon oxide layer. Following the formation of buffer layer 6, protective layer 8 is formed overlying buffer layer 6. Protective layer 8 typically has a thickness ranging from 50 to 200 nanometers, and is preferably a silicon nitride layer. Alternatively, protective layer 8 may be a boronitride layer, a silicon oxynitride, or the like. Photoresist mask 10, which overlies a portion of protective layer 8 is formed using standard photolithographic patterning processes.

Figure 2:
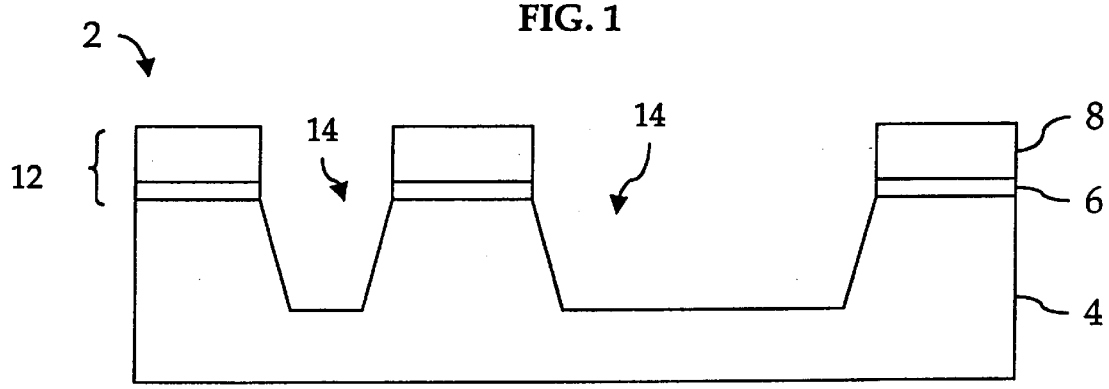

In FIG. 2, photoresist mask 10 is used to etch protective layer 8 and underlying buffer layer 6, and form a patterned trench mask 12, comprising a remaining portion of protective layer 8 and a remaining portion of buffer layer 6, that overlies a portion of semiconductor substrate 4. In addition, semiconductor substrate 4 is etched in regions not covered by patterned trench mask 12 to form trenches 14 in semiconductor substrate 4. Trenches 14 and patterned trench mask 12 are formed using conventional etching techniques. In addition, it should be appreciated that photoresist mask 10 may be removed using conventional photoresist stripping techniques, either before or after trenches 14 have been formed.

Figure 3:
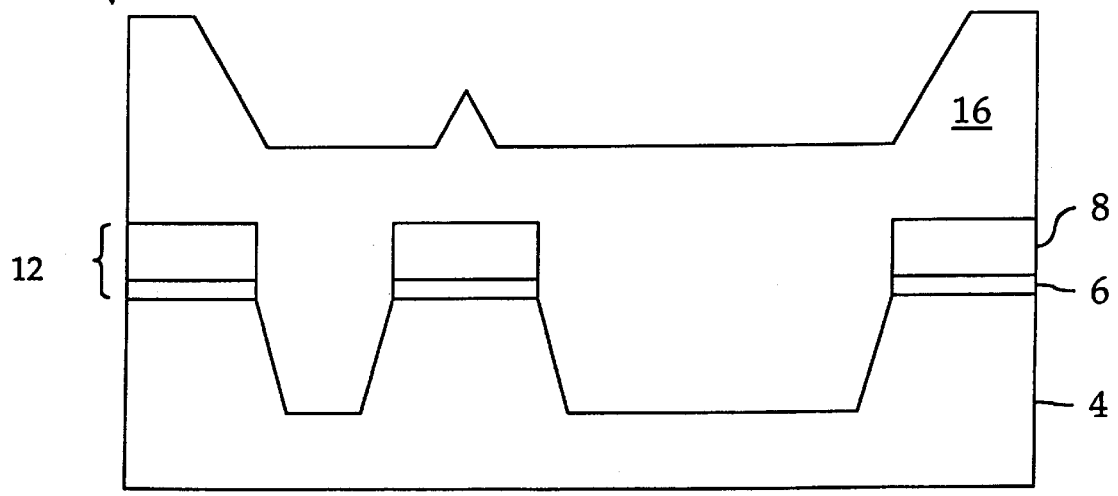

In FIG. 3, a dielectric layer 16 is then formed overlying semiconductor substrate 4. Dielectric layer 16 overlies patterned trench mask 12 and lies within trenches 14, such that it substantially fills trenches 14. In a preferred embodiment, dielectric layer 16 is a layer of plasma oxide, which is formed using a commercially available high density plasma deposition system. In an alternative embodiment, dielectric layer 16 is a layer of chemically vapor deposited oxide, which is deposited using ozone and tetraethylorthosilicate (TEOS) as source gases. It should be appreciated that dielectric layer 16 may also be formed using other dielectric materials, such as germanium oxide, boro-phosphate-silicate-glass (BPSG), phosphate-silicate-glass (PSG), boro-silicate-glass (BSG), spin-on-glass, or the like, and that it may be may be formed using other techniques such, electron cyclotron resonance deposition, spin-on deposition, or the like. In addition, it should also be appreciated that a trench liner (not shown) may also be formed within trenches 14 prior to forming dielectric layer 16. For example, a portion of semiconductor substrate 4 may be thermally oxidized to form a thermal oxide layer along the sidewall and bottom of trenches 14 prior to depositing dielectric layer 16. Note, the trench liner will have a thickness which is insufficient to fill trenches 14.

Figure 4:
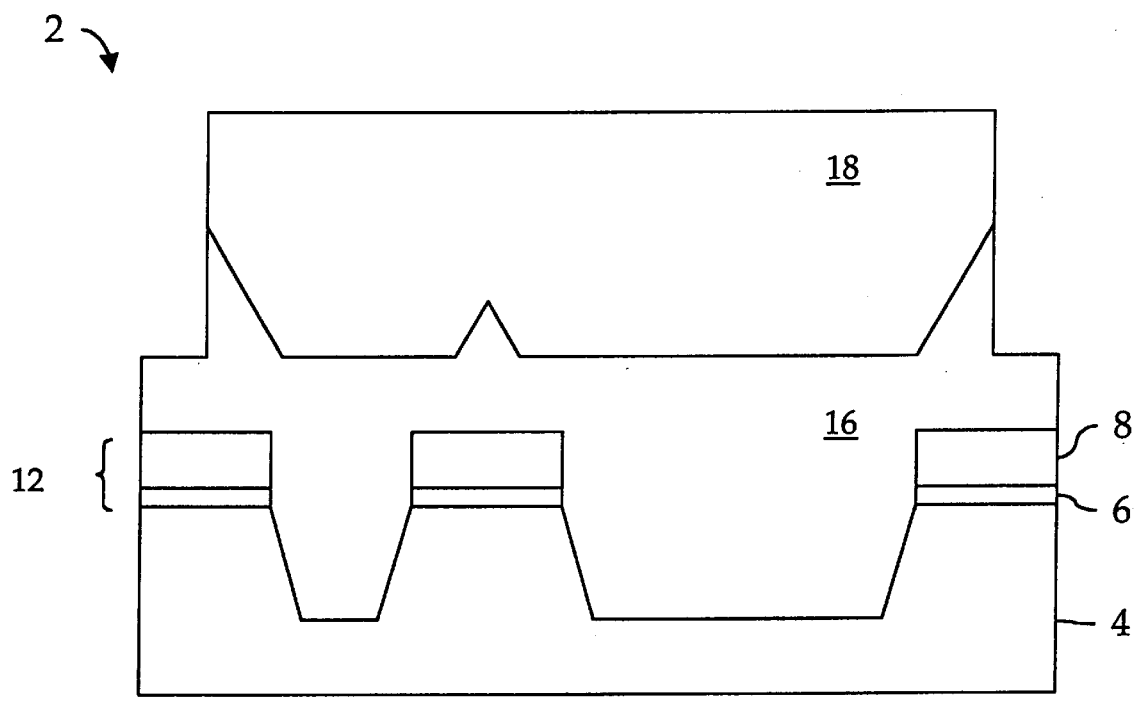

In FIG. 4, a patterned masking layer 18 is then formed overlying a portion of dielectric layer 16, and then used to etch a portion of dielectric layer 16. Typically, patterned masking layer 18 is formed over portions of dielectric layer 16 that lie at a lower elevation than other portions of dielectric layer 16. For example, patterned masking layer 18 may be formed over wide trenches, but not over wide portions of the patterned trench mask. Note, etching of dielectric layer 16 reduces the amount of time required to planarize dielectric layer 16 because less material has to be removed during polishing. In one embodiment, patterned masking layer 18 is formed using the reverse image of photoresist mask 10. Dielectric layer 16 may be etched using a wet or a dry etch process, or a combination thereof.

Figure 5:
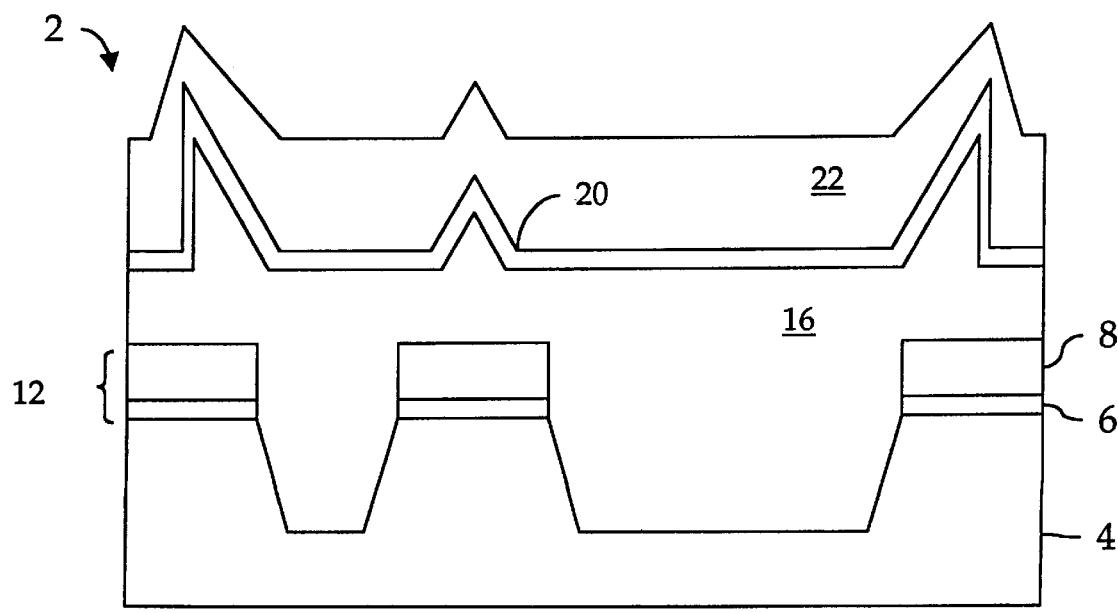

In FIG. 5, patterned masking layer 18 is then removed using conventional stripping techniques, and an intermediate polishing layer 20 is formed overlying dielectric layer 16. A dielectric layer 22 is then formed overlying intermediate polishing layer 20. Intermediate polishing layer 20 is formed using a material that is different from that of dielectric layer 16 and dielectric layer 22, and typically has a thickness ranging from 5 to 50 nanometers. In one embodiment, intermediate polishing layer 20 is a layer of material which polishes at a faster rate than dielectric layer 16 and dielectric layer 22, such as a layer of polysilicon. It should be appreciated that intermediate polishing layer 20 may be formed using other materials which differ from that of dielectric layer 16 and dielectric layer 22. For example, intermediate polishing layer 20 may be a layer of amorphous silicon, silicon nitride, germanium oxide, boro-phosphate-silicate-glass (BPSG), phosphate-silicate-glass (PSG), boro-silicate-glass (BSG), spin-on-glass, or the like. In a preferred embodiment, dielectric layer 22 is a layer of plasma oxide, which is formed using a commercially available high density plasma deposition system. In an alternative embodiment, dielectric layer 22 is a layer of chemically vapor deposited oxide, which is deposited using ozone and tetraethylorthosilicate (TEOS) as source gases. It should be appreciated that dielectric layer 22 may also be formed using other dielectric materials, such as germanium oxide, boro-phosphate-silicate-glass (BPSG), phosphate-silicate-glass (PSG), boro-silicate-glass (BSG), spin-on-glass, or the like, and that it may be may be formed using other techniques such, electron cyclotron resonance deposition, spin-on deposition, or the like. Dielectric layer 22 has a thickness which is less than dielectric layer 16, and typically has a thickness ranging from 50 to 100 nanometers.

Figure 6:
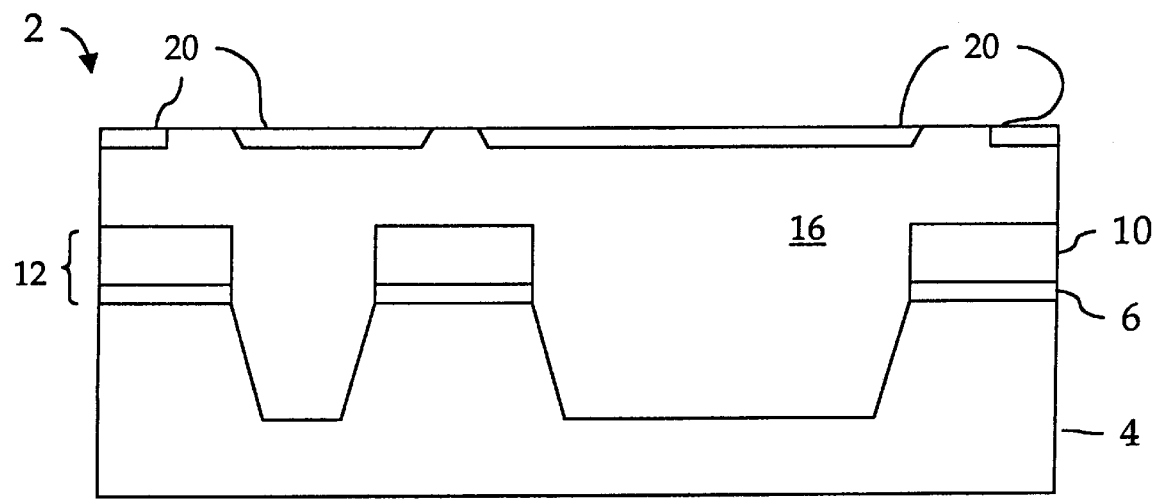

In FIG. 6, dielectric layer 22 is polished to expose a portion of intermediate polishing layer 20, and to determine the polishing rate of dielectric layer 22. In one embodiment, dielectric layer 22 and intermediate polishing layer 20 are polished to form a substantially planar surface comprising an exposed portion of dielectric layer 16 and an exposed portion of intermediate polishing layer 20, as shown in FIG. 6. Since the initial thickness of dielectric layer 22 is known, its polishing rate can be determined by measuring the time required to remove dielectric layer 22 and expose intermediate polishing layer 20. In one embodiment, the time required to expose a portion of intermediate polishing layer 20 is determined using an endpoint detection system that monitors the current draw of the motor used to rotate semiconductor substrate 4 during polishing, as is described in U.S. Pat. No. 5,036,015 or U. S. Pat. No. 5,846,882. The subject matter of U.S. Pat. No. 5,036,015 and U. S. Pat. No. 5,846,882 is expressly incorporated herein by reference. In an alternative embodiment, the time required to expose a portion of intermediate polishing layer 20 is determined using an optical endpoint detection system, such as that described in U.S. Pat. No. 5,433,650. The subject matter of U.S. Pat. No. 5,433,650 is expressly incorporated herein by reference.

The calculated polishing rate for dielectric layer 22 is then used to determine at least one polishing condition which is subsequently used to polish dielectric layer 16. In one embodiment, the calculated polishing rate for dielectric layer 22 is used to determine a polishing time for dielectric layer 16. In an alternative embodiment, the polishing rate of dielectric layer 22 is used as feedback to adjust a polishing condition that changes the subsequent polishing rate of dielectric layer 16. For example, it may be used to determine whether or not the surface of the polishing pad needs to be conditioned prior to polishing dielectric layer 16, or it may be used to adjust the slurry flow rate, the angular speed of the carrier and the semiconductor substrate, the angular speed of the polishing pad, the polishing down force applied to the semiconductor substrate, or the like, when dielectric layer 16 is polished.

Figure 7:
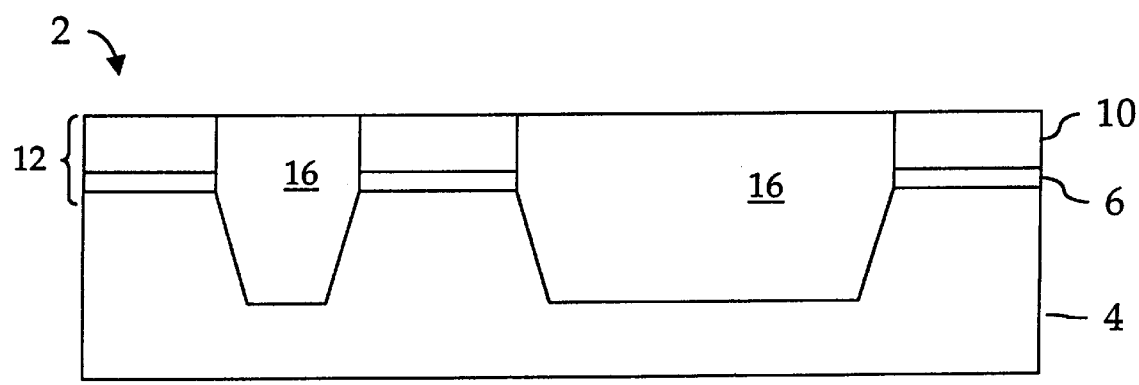

In FIG. 7, dielectric layer 16 is then polished using the previously determined polishing condition. In one embodiment dielectric layer 16 is polished, using a polishing time that was calculated from the polishing rate of dielectric layer 22, to expose a portion of patterned trench mask 12, as shown in FIG. 7. It should be appreciated that the remaining portion of intermediate polishing layer 20 may be removed either prior to polishing dielectric layer 16, or at the same time that dielectric layer 16 is polished. For example, if intermediate polishing layer 20 is made of a material which polishes faster than dielectric layer 16, then it is preferably polished with dielectric layer 16 and removed. However, if intermediate polishing layer 20 polishes at a slower rate than dielectric layer 16, then it is preferably removed prior to polishing dielectric layer 16.

Figure 8:
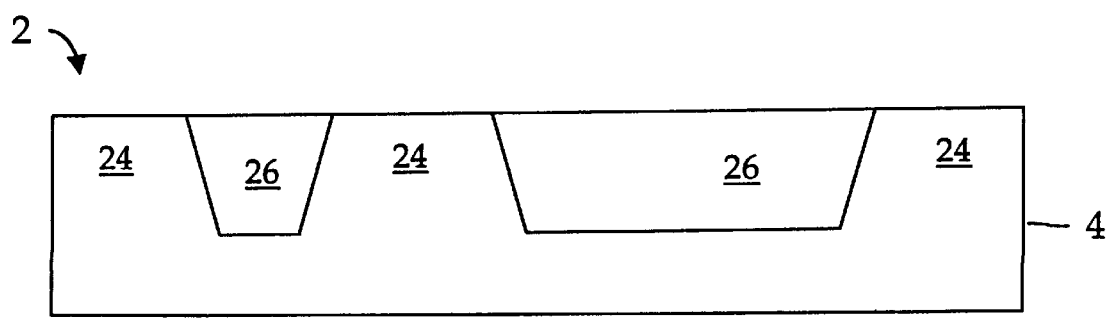

In FIG. 8, patterned trench mask 12 is then removed to define active regions 24 and trench isolation regions 26 within semiconductor substrate 4. Patterned trench mask 12 may be removed using a wet or a dry etch process, or a combination thereof.

Although the present invention has been illustrated and described with respect to the formation of a trench isolation structure it is not intended that the present invention be limited to such an embodiment. It should be appreciated that the present invention may also be used to planarize a dielectric layer that overlies a patterned conductive layer. For example, it may be used to planarize a dielectric layer overlying transistor gate electrodes or metal interconnects to form a planarized interlevel dielectric layer. Moreover, the present invention may also be used to planarize a conductive layer that overlies a patterned dielectric layer. For example, it may be used to planarize a metal layer overlying a patterned dielectric layer to form contact plugs, a via plugs, or inlaid metal interconnects.

Thus it is apparent that there has been provided, in accordance with the present invention, a method for planarizing a layer of material in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A method for forming an integrated circuit comprising the steps of:

providing a substrate;

forming a patterned trench mask overlying the substrate;

etching the substrate to form a trench in the substrate;

forming a first dielectric layer overlying the substrate, wherein the first dielectric layer overlies the patterned trench mask and lies within the trench;

forming a patterned masking layer overlying the first dielectric layer;

using the patterned masking layer to etch a portion of the first dielectric layer;

removing the patterned masking layer;

forming an intermediate polishing layer overlying the first dielectric layer, after the patterned masking layer has been removed;

forming a second dielectric layer overlying the intermediate polishing layer;

polishing the second dielectric layer to expose a portion of the intermediate polishing layer, and to determine a polish rate for the second dielectric layer;

using the polish rate for the second dielectric layer to determine a polish time for the first dielectric layer; and polishing the first dielectric layer for the polish time to expose the patterned trench mask.

2. The method of claim 1, wherein the first dielectric layer is further characterized as a first silicon oxide layer.

3. The method of claim 2, wherein the second dielectric layer is further characterized as a second silicon oxide layer.

4. The method of claim 1, wherein the intermediate polishing layer is further characterized as a silicon layer.

5. The method of claim 1, wherein the patterned masking layer is further characterized as a patterned resist layer.

6. The method of claim 1, wherein the patterned trench mask comprises a patterned silicon nitride layer.

7. The method of claim 1, wherein the patterned trench mask comprises a patterned silicon oxide layer.

8. A method for forming an integrated circuit comprising the steps of:

providing a substrate;

forming a patterned trench mask overlying the substrate;

etching the substrate to form a trench in the substrate;

forming a first dielectric layer overlying the substrate, wherein the first dielectric layer overlies the patterned trench mask and lies within the trench;

forming an intermediate polishing layer overlying the first dielectric layer;

forming a second dielectric layer overlying the intermediate polishing layer;

polishing the second dielectric layer to form an exposed portion of the intermediate polishing layer, and to determine a polish rate for the second dielectric layer;

using the polish rate for the second dielectric layer to determine a polish time for the first dielectric layer; and polishing the first dielectric layer for the polish time to expose the patterned trench mask.

9. The method of claim 8, wherein the first dielectric layer is further characterized as a first silicon oxide layer.

10. The method of claim 9, wherein the second dielectric layer is further characterized as a second silicon oxide layer.

11. The method of claim 8, wherein the intermediate polishing layer is further characterized as a silicon layer.

12. The method of claim 8, wherein the patterned trench mask comprises a patterned silicon nitride layer.

13. The method of claim 8, wherein the patterned trench mask comprises a patterned silicon oxide layer.

14. The method of claim 8, further comprising the step of removing the exposed portion of the intermediate polishing layer prior to polishing the first dielectric layer.

15. A method for forming an integrated circuit comprising the steps of:

providing a substrate;

forming a patterned layer overlying the substrate;

forming a first layer of material overlying the patterned layer;

forming a second layer of material overlying the first layer of material, wherein the second layer of material is different from the first layer of material;

forming a third layer of material overlying the second layer of material, wherein the third layer of material is different from the second layer of material;

polishing the third layer of material to form an exposed portion of the second layer of material, and to determine a polish rate for the third layer of material;

using the polishing rate for the third layer of material to determine a polishing condition for the first layer of material; and polishing the first layer of material using the polishing condition to form a planarized surface.

16. The method of claim 15, wherein the first layer of material is further characterized as a first dielectric layer.

17. The method of claim 15, wherein the third layer of material is further characterized as a second dielectric layer.

18. The method of claim 15, wherein the patterned layer is further characterized as a patterned dielectric layer.

19. The method of claim 15, wherein the patterned layer is further characterized as a patterned conductive layer.

20. The method of claim 15, further comprising the step of removing the exposed portion of the second layer of material prior to polishing the first layer of material.

21. The method of claim 15, wherein the polishing condition is further characterized as a polishing time.

22. The method of claim 15, wherein the polishing condition is further characterized as an angular speed of the substrate.

23. The method of claim 15, wherein the polishing condition is further characterized as a down force applied to the substrate.

24. The method of claim 15, wherein the polishing condition is further characterized as a slurry flow rate.

25. The method of claim 15, wherein the polishing condition is further characterized as an angular speed of a polishing pad.

26. The method of claim 15, wherein the polishing condition is further characterized as a conditioned polishing pad surface.

* * * * *

UNITED STATES PATENT AND TRADEMARK OFFICE
CERTIFICATE OF CORRECTION

| | | |
|---|---|---|
| PATENT NO. | : 6,207,533 B1 | Page 1 of 1 |
| DATED | : March 27, 2001 | |
| INVENTOR(S) | : Feng Gao | |

It is certified that error appears in the above-identified patent and that said Letters Patent is hereby corrected as shown below:

<u>Drawings,</u>
Sheet 3 of 3, Figs. 6-7, the reference numeral 10 should be changed to 8.

Signed and Sealed this

Seventh Day of May, 2002

Attest:

Attesting Officer

JAMES E. ROGAN
*Director of the United States Patent and Trademark Office*